United States Patent
Zhang et al.

(10) Patent No.: US 10,484,008 B2
(45) Date of Patent: Nov. 19, 2019

(54) MEMORY SYSTEM WITH ON-THE-FLY ERROR DETECTION AND TERMINATION AND OPERATING METHOD THEREOF

(71) Applicant: SK hynix Inc., Gyeonggi-do OT (KR)

(72) Inventors: Fan Zhang, Fremont, CA (US); Chenrong Xiong, San Jose, CA (US); Abhiram Prabhakar, San Jose, CA (US); Aman Bhatia, San Jose, CA (US); Yu Cai, San Jose, CA (US); Naveen Kumar, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 124 days.

(21) Appl. No.: 15/719,156

(22) Filed: Sep. 28, 2017

(65) Prior Publication Data

US 2019/0097654 A1    Mar. 28, 2019

(51) Int. Cl.
*H03M 13/11* (2006.01)
*G06F 11/10* (2006.01)
*G11C 29/52* (2006.01)

(52) U.S. Cl.
CPC ..... *H03M 13/1111* (2013.01); *G06F 11/1004* (2013.01); *G06F 11/1012* (2013.01); *G06F 11/1068* (2013.01); *G11C 29/52* (2013.01)

(58) Field of Classification Search
CPC ........... H03M 13/1111; G06F 11/1068; G06F 11/1004; G11C 29/52
See application file for complete search history.

(56) References Cited

U.S. PATENT DOCUMENTS

| | | | |
|---|---|---|---|
| 8,522,121 B2 | 8/2013 | Zopf | |
| 2009/0319858 A1* | 12/2009 | Sharon | H03M 13/1114 714/752 |
| 2011/0080669 A1* | 4/2011 | Parthasarathy | G11B 20/1866 360/49 |
| 2015/0229337 A1* | 8/2015 | Alhussien | H03M 13/35 714/773 |
| 2017/0162258 A1* | 6/2017 | Anholt | G11C 16/08 |

* cited by examiner

*Primary Examiner* — Guy J Lamarre
(74) *Attorney, Agent, or Firm* — IP & T Group LLP (57) ABSTRACT

Decoding method includes calculating cyclic redundancy check (CRC) parity bits for data on-the-fly; performing a low-density parity-check (LDPC) decoding for the data; if it is determined that an iteration of is finished, updating the calculated CRC parity bits to generate CRC parity bits; comparing the generated CRC parity bits with CRC bits included in the data; and terminating the LDPC decoding based on the comparison result.

18 Claims, 5 Drawing Sheets

MEMORY SYSTEM WITH ON-THE-FLY ERROR DETECTION AND TERMINATION AND OPERATING METHOD THEREOF

BACKGROUND

1. Field

The present disclosure relates generally to error correcting codes, and in particular, to a decoding scheme based on low density parity check codes.

2. Description of the Related Art

Error correction codes (ECC) are used to detect and/or correct errors in received data in order to increase performance and efficiency of systems. Low-density parity check (LDPC) codes are a class of ECC codes that have very good performance. LDPC codes are used in storage systems, communication systems, and the like to reduce power consumption while allowing higher throughput, and/or increased reliability.

SUMMARY

Aspects of the invention include a decoding method. In accordance with an embodiment of the invention, the decoding method may include calculating cyclic redundancy check (CRC) parity bits for data on-the-fly, performing a low-density parity-check (LDPC) decoding for the data; if it is determined that the LDPC decoding is finished, updating the calculated CRC parity bits to generate CRC parity bits, comparing the generated CRC parity bits with CRC bits included in the data, and terminating the LDPC decoding based on the comparison result.

Further aspects of the invention include a memory system. In accordance with an embodiment of the present invention, the memory system may include a storage and a decoder. The decoder is suitable for calculating cyclic redundancy check (CRC) parity bits for data from the storage on-the-fly, performing a low-density parity-check (LDPC) decoding for the data, if it is determined that an iteration is finished, updating the calculated CRC parity bits to generate CRC parity bits; comparing the generated CRC parity bits with CRC bits included in the data, and terminating the LDPC decoding based on the comparison result.

Additional aspects of the invention include a memory controller. In accordance with an embodiment of the present invention, the memory controller may include a receiver for receiving data and a decoder. The decoder is suitable for calculating cyclic redundancy check (CRC) parity bits for data from the storage on-the-fly; performing a low-density parity-check (LDPC) decoding for the data, if it is determined that an iteration is finished, updating the calculated CRC parity bits to generate CRC parity bits, comparing the generated CRC parity bits with CRC bits included in the data, and terminating the LDPC decoding based on the comparison result.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Various embodiments of the present disclosure provide a scheme to reduce the average iteration number of low-density parity-check (LDPC) decoding algorithms and to reduce the decoding latency of an LDPC decoder, thereby improving the throughput of the LDPC decoder. LDPC codes are a family of linear block forward error-correction (ECC) code whose parity check matrix can be represented by a low-density parity-check matrix. They provide excellent error-correction performance. There are many iterative decoding algorithms for LDPC codes, such as bit-flipping (BF) decoding algorithms, belief-propagation (BP) decoding algorithms, sum-product (SP) decoding algorithms, min-sum (MS) decoding algorithms and min-max (MM) decoding algorithms.

Figure 1:
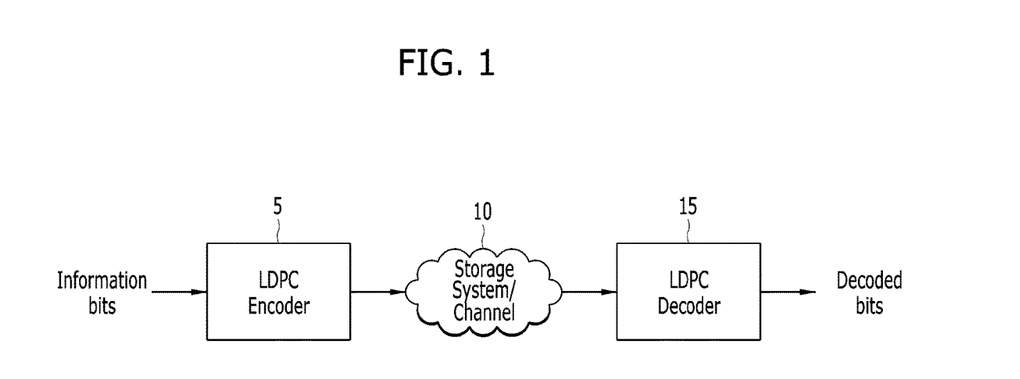
FIG. 1 is a high level block diagram illustrating an error correcting system in accordance with embodiments of the present disclosure.

FIG. 1 is a high level block diagram illustrating an error correcting system, in accordance with embodiments of the present disclosure. In the example shown, the error correcting system may include an encoder and a decoder using LDPC coding and decoding algorithms. That is, the error correcting system may include a LDPC encoder 5 and a LDPC decoder 15.

The LDPC encoder 5 may receive information bits including data which is desired to be stored in a storage system (or a memory system) 10. The LDPC encoder 5 may encode the information bits to output LDPC encoded data. The LDPC encoded data from the LDPC encoder 5 may be written to a storage device or memory device of the storage system 10. In various embodiments, the storage device may include a variety of storage types or media. In some embodiments, during being written to or read from the storage device, data is transmitted and received over a wired and/or wireless channel. In this case, the errors in the received codeword may be introduced during transmission of the codeword.

When the stored data in the storage system 10 is requested or otherwise desired (e.g., by an application or user which stored the data), the LDPC decoder 15 may perform LDPC decoding data received from the storage system 10, which may include some noise or errors. In various embodiments, the LDPC decoder 15 may perform LDPC decoding using the decision and/or reliability information for the received data. The decoded bits generated by the LDPC decoder 15 are transmitted to the appropriate entity (e.g., the user or application which requested it). With proper encoding and decoding, the information bits match the decoded bits.

Figure 2:
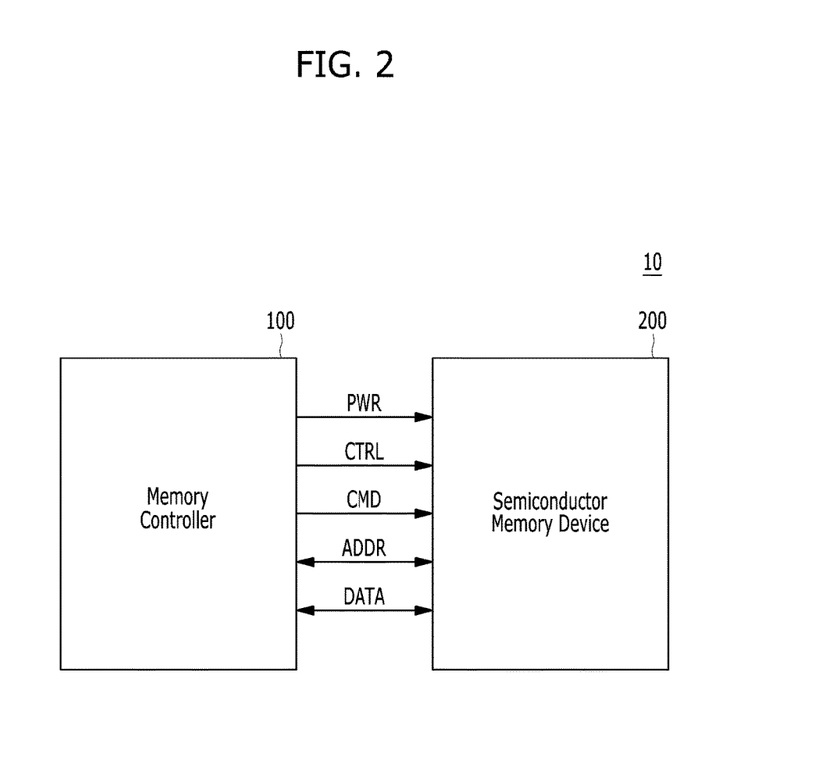
FIG. 2 is a block diagram schematically illustrating a memory system in accordance with embodiments of the present disclosure.

FIG. 2 is a block diagram schematically illustrating a memory system 10 in accordance with an embodiment of the present disclosure.

Referring FIG. 2, the memory system 10 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 3:
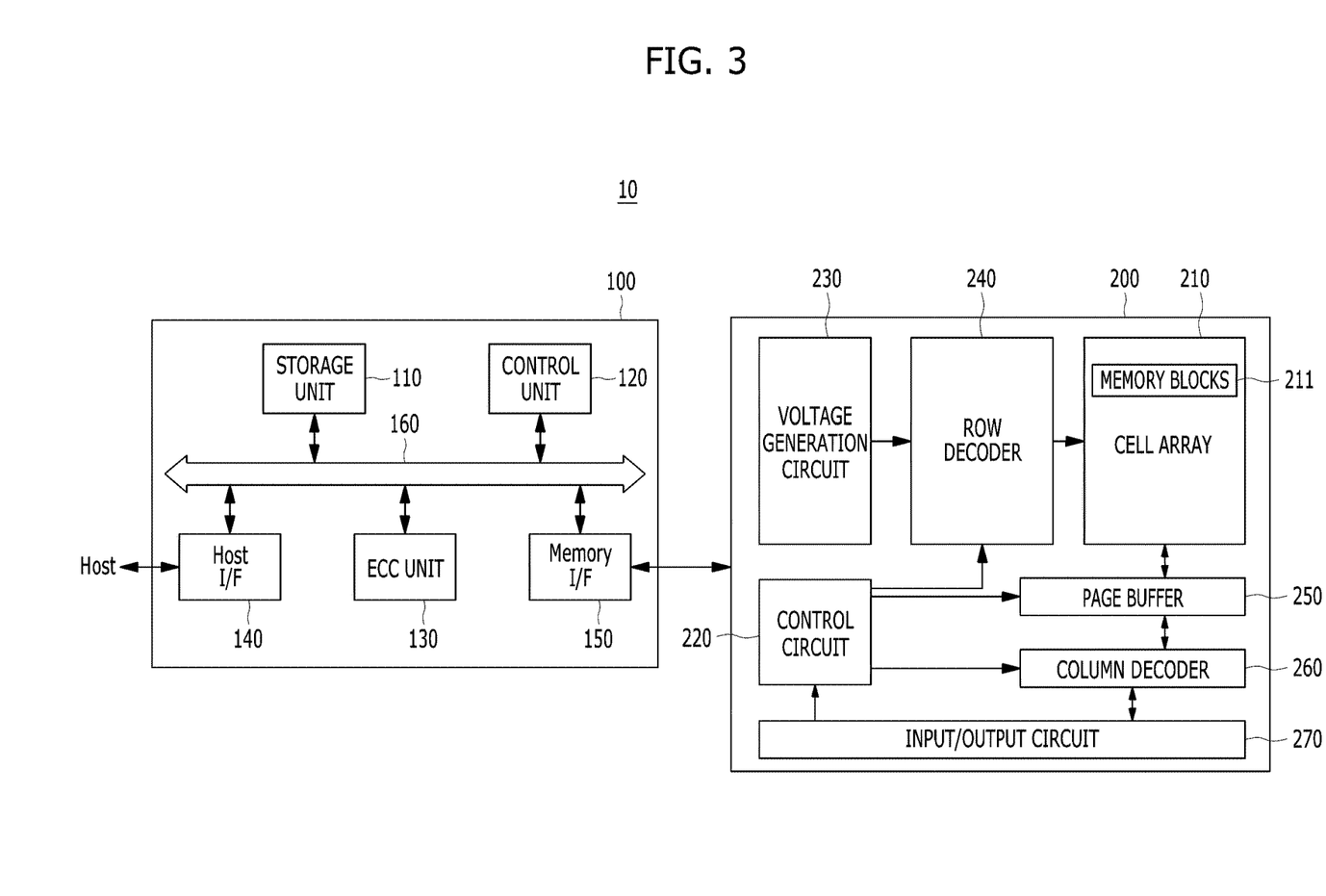
FIG. 3 is a block diagram illustrating a memory system in accordance with embodiments of the present disclosure.

FIG. 3 is a detailed block diagram illustrating a memory system in accordance with an embodiment of the present invention. For example, the memory system of FIG. 3 may depict the memory system 10 shown in FIG. 2.

Referring to FIG. 3, as shown in FIG. 2, the memory system 10 may include the memory controller 100 and the semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 may be connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 4:
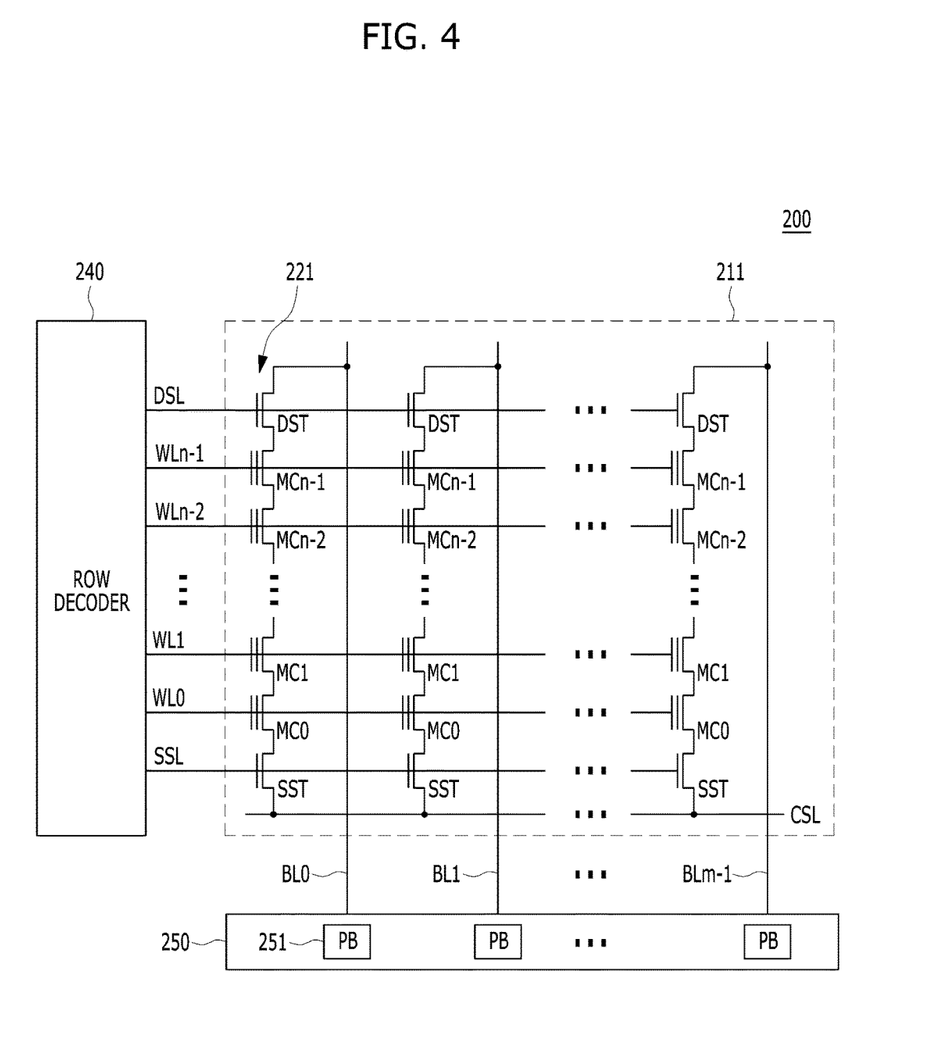
FIG. 4 is a circuit diagram illustrating a memory block of a memory device in accordance with embodiments of the present disclosure.

FIG. 4 is a circuit diagram illustrating a memory block of a semiconductor memory device in accordance with an embodiment of the present invention. For example, a memory block of FIG. 4 may be the memory blocks 211 of the memory cell array 210 shown in FIG. 3.

Referring to FIG. 4, the memory blocks 211 may include a plurality of cell strings 221 coupled to bit lines BL0 to BLm-1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn-1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 5:
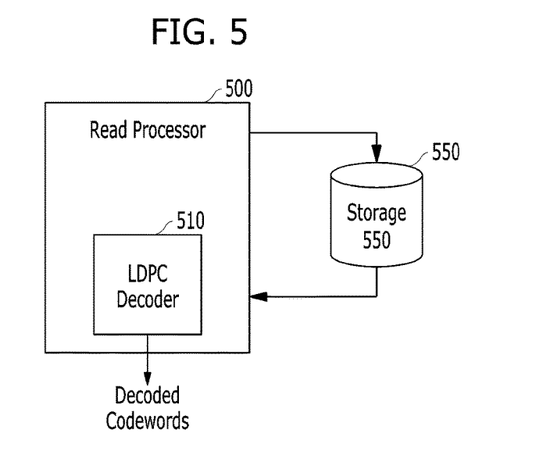
FIG. 5 is a diagram illustrating a storage system in accordance with embodiments of the present disclosure.

FIG. 5 is a diagram illustrating a storage system in accordance with embodiments of the present disclosure.

Referring to FIG. 5, the storage system may include a storage 550 and a memory controller as a read processor 500. The read processor 500 may perform a read operation for data stored in the storage 550. During the read operation, the read processor 500 may read data from the storage 500, which may include some noise or errors, and perform error correction for the read data. In some embodiments, the read processor 500 may include a decoder, for example, the LDPC decoder 510 may perform LDPC decoding. Also, the read processor 500 may include a receiver (not shown) for receiving data from the storage 550.

When the stored data in the storage 550 is requested or otherwise desired (e.g., by an application or user which stored the data), the LDPC decoder 510 may receive data from the storage 550. The received data may include some noise or errors. The LDPC decoder 510 may perform detection on the received data and output decision and/or reliability information. The LDPC decoder 510 may include one of a soft detector and a hard detector, wherein the soft detector or hard detector can provide channel information for decoders, such as the LDPC decoder. For example, the soft detector outputs reliability information and a decision for each detected bit. On the other hand, the hard detector outputs a decision on each bit without providing corresponding reliability information. As an example, the hard detector may output a decision that a particular bit is a "1" or a "0" without indicating how certain or sure the detector is in that decision. In contrast, the soft detector outputs a decision and reliability information associated with the decision. In general, reliability information indicates how certain the detector is in a given decision. In one example, a soft detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

Also, the LDPC decoder 510 may perform LDPC decoding using the decision and/or reliability information. The LDPC decoder 510 may include one of a soft decoder and a hard decoder. The soft decoder utilizes both the decision and the reliability information to decode the codeword. The hard decoder utilizes only the decision values to decode the codeword. The decoded bits generated by the LDPC decoder 510 are transmitted to the appropriate entity (e.g., the user or application which requested it). With proper encoding and decoding, the information bits match the decoded bits.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

LDPC codes are usually represented by bipartite graphs. One set of nodes (e.g., the variable or bit nodes) correspond to elements of the codeword, and the other set of nodes (e.g., check nodes) correspond to the set of parity check constraints satisfied by the code words. Typically, the edge connections are chosen at random. The error correction capability of an LDPC code is improved if cycles of short length are avoided in the graph.

Figure 6:
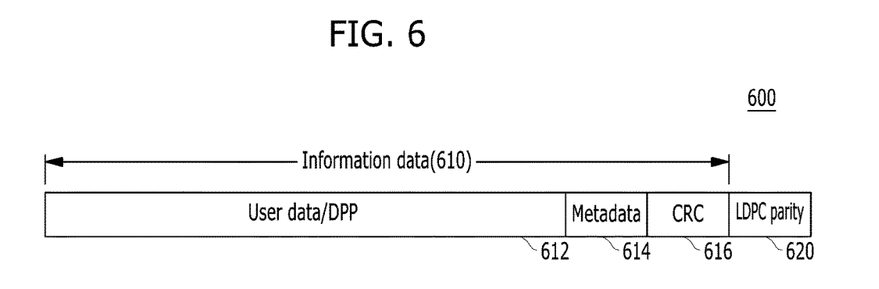
FIG. 6 is a diagram illustrating a format of a codeword to be stored in a storage system in accordance with embodiments of the present disclosure.

FIG. 6 is a diagram illustrating a format of a codeword 600 to be stored in a storage system in accordance with embodiments of the present disclosure.

Referring to FIG. 6, the codeword 600 may include information data 610 and parity 620. In some embodiments, the codeword 600 may be generated by low-density parity-check (LDPC) codes. In other words, the information data 610 may be protected by LDPC codes and the parity 620 may be LDPC parity. The information data 610 may include user data with data path protection (DPP) 612, meta-data 614 and cyclic redundancy check (CRC) parity bits 616.

A CRC code may be an error-detecting code commonly used in digital networks and storage devices to detect accidental changes to raw data. In some embodiments, 4 bytes of CRC may be applied to 2 KB ECC solutions and 6 bytes of CRC may be applied to 4 KB ECC solutions.

In a read path of the digital networks and/or storage devices, the noisy data may be fed into a decoder. For example, during a read operation as shown in FIG. 5, the noisy data may be fed into the LDPC decoder 510 of the read processor 500 as the memory controller.

Figure 7:
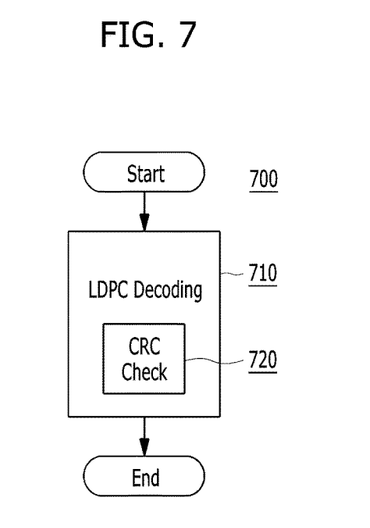
FIG. 7 is a flow chart schematically illustrating a decoding operation in accordance with embodiments of the present disclosure.

In a typical LDPC decoder (as shown in FIG. 7), if the LDPC checksum is zero, the decoder may be terminated. The CRC parity bits 616 will be computed based on the decoded user data 612 and meta-data 614 after the LDPC decoding. If the computed CRC parity bits match decoded CRC parity bits, decoding may be successful. Otherwise, a mis-correction may be declared.

In some embodiments of the present disclosure, it is supposed that $x=[x_0, x_1, \ldots, x_{N-1}]$ is a bit vector, and $H=[h_{i,j}]$ is an M×N low-density parity-check matrix with a binary value $h_{i,j}$ at the intersection of row i and column j. Then each row of H provides a parity check for x. If x is a codeword of H, it has $xH^T=0$. It is assumed that x is transmitted over a noisy channel, and the corrupted channel output is $y=[y_0, y_1, \ldots, y_{N-1}]$ and its hard decision is $z=[z_0, z_1, \ldots, z_{N-1}]$. The syndrome of z may be a binary vector calculated by $s=[s_0, s_1, \ldots, s_{N-1}]=zH^T$, with a weight of $\|s\|$ which represents the number of unsatisfied check nodes and is also called the checksum since $\|s\|=\Sigma_{i=0}^{M-1} s_i$. It is supposed that $z^{(j)}=[z_0, z_1, \ldots, z_{N-1}]$ is the hard decision of the j-th iteration and the syndrome vector of the j-th iteration is $s^{(j)}=[s_0^{(j)}, s_1^{(j)}, \ldots, s_{N-1}^{(j)}]=z^{(j)}H^T$. Then $\|s\|^{(j)}$ is the checksum of the j-th iteration.

FIG. 7 is a flow chart schematically illustrating a decoding operation 700 in accordance with embodiments of the present disclosure. In some embodiments, the decoding operation 700 may be performed by the LDPC decoder 510 of the read processor 500 (or a memory controller) in FIG. 5.

Referring to FIG. 7, the CRC check 720 can be integrated into the LDPC decoding procedure 710. The CRC check 720 including a CRC parity calculation may not be conducted subsequently to the LDPC decoding 710. Instead, the CRC parity calculation maybe conducted concurrently with the LDPC decoding 710. For intermediate results of every iteration of the LDPC decoding 710, the CRC check 720 can be calculated and used as one of criterions of decoding termination.

Additionally, the decoding operation 700 may include operations of comparing the generated CRC parity bits with CRC bits included in the data, and terminating the LDPC decoding 710 based on the comparison result.

In some embodiments, the terminating of the LDPC decoding 710 may be performed, if it is determined that the generated CRC parity bits match with the CRC bits included in the data and the LDPC checksum is less than a predetermined threshold. Furthermore, the terminating of the LDPC decoding 710 may include outputting hard decision values in accordance with the LDPC decoding.

In some embodiments, the CRC check 720 may include updating the calculated CRC parity bits by feeding predetermined bits into a CRC encoder.

In some embodiments, the LDPC decoding 710 may include processing, for each iteration of a plurality of iterations, updating messages for a circulant.

Figure 8:
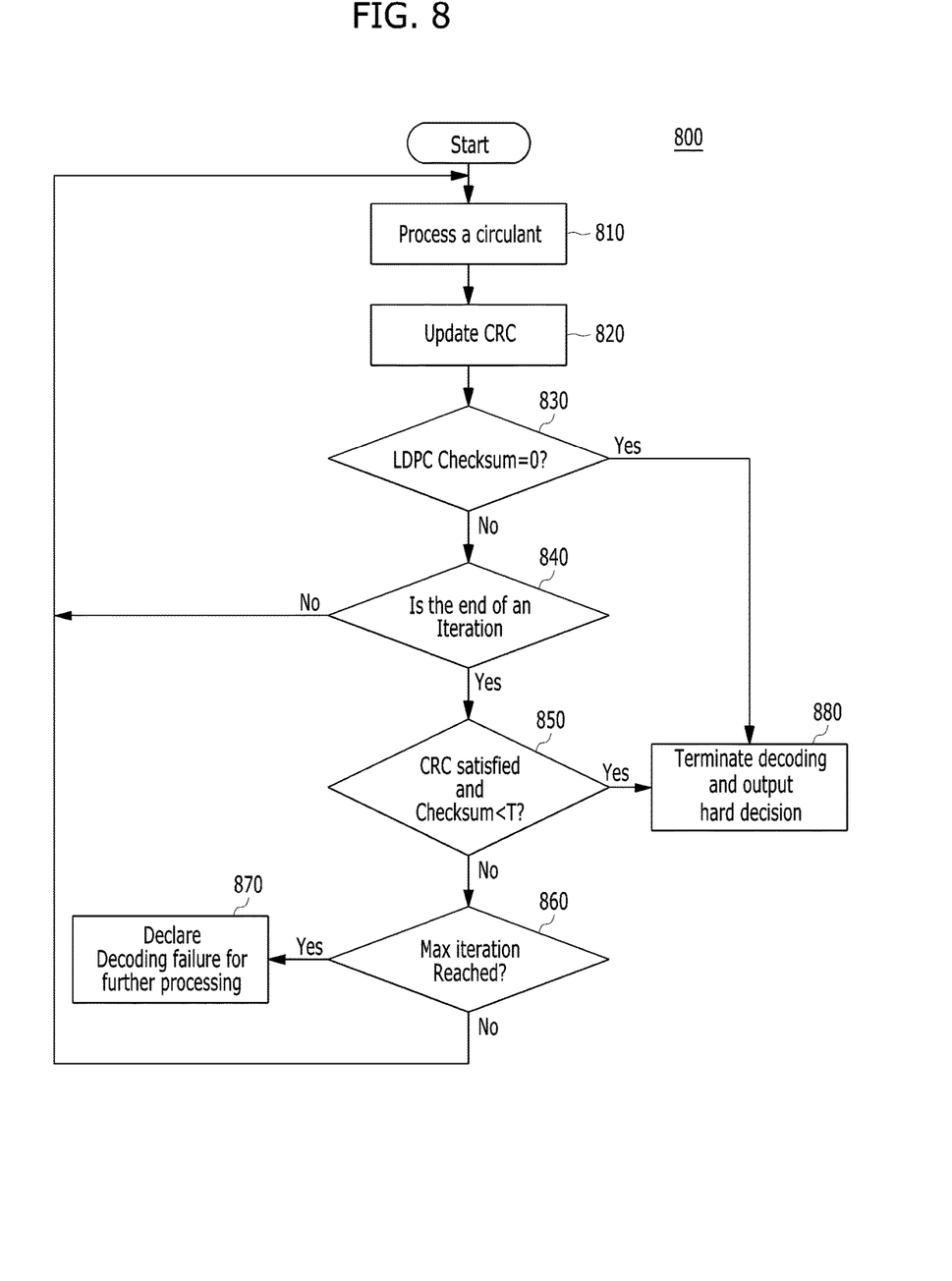
FIG. 8 is a flow chart illustrating an example of a decoding operation in accordance with embodiments of the present disclosure.

FIG. 8 is a flow chart illustrating an example of a decoding operation 800 in accordance with embodiments of the present disclosure. In some embodiments, the decoding operation 800 may be performed by the LDPC decoder 510 of the read processor 500 (or a memory controller) in FIG. 5, and may correspond to the LDPC decoding 710 and CRC check 720 in FIG. 7.

Referring to FIG. 8, the decoding operation 800 may include operations 810 to 880. At operation 810, the processor 500 may perform the LDPC decoding for the data. In other words, the processor 500 may process, for each iteration of a plurality of iterations, updating messages of the data for a circulant.

After the hard decision of a circulant is updated in operation 820, the processor 500 may perform updating the calculated CRC parity bits to generate CRC parity bits. In some embodiments, the operation 820 may include updating the calculated CRC parity bits by feeding predetermined p bits into a CRC encoder.

Then, at operation 830, the processor 500 may check if the LDPC checksum is equal to 0. If it is determined that the LDPC checksum is equal to 0, the processor 500 may proceed to operation 880. Otherwise, the processor 500 may proceed to operation 840.

At operation 840, the processor 500 may check whether the end of an iteration is. If so, the processor 500 may proceed to operation 850. Otherwise, the processor 500 may proceed to operation 810.

At operation 850, the processor 500 may check whether the CRC is satisfied. In other words, the processor 500 may compare the CRC parity bits with CRC bits included in the data. Also, at operation 850, the processor 500 may check whether the LDPC checksum is less than predetermined threshold T. If it is determined that the generated CRC parity bits match with the CRC bits and the LDPC checksum is less than the predetermined threshold T, the processor 500 may proceed to operation 880. Otherwise, the processor 500 may proceed to operation 860.

At operation 860, the processor 500 may check whether the maximum iteration is reached. If the maximum iteration is reached, the processor 500 may proceed to operation 870 to declare decoding failure. If the maximum iteration is not reached, the processor 500 may proceed to operation 810.

At operation 880, the processor 500 may perform terminating of the LDPC decoding. That is, the processor 500 may terminate the LDPC decoder 510. Also, the processor 500 may perform outputting hard decision values in accordance with the LDPC decoding.

As such, instead of calculating CRC parity bits after LDPC decoding, embodiments the present disclosure may calculate the CRC parity bits on-the-fly, such that for each iteration of the LDPC decoding, the CRC parity can be calculated concurrently based on the hard decision of the each iteration, but not after the LDPC decoding as used in the conventional scheme. When the LDPC decoder 510, such as bit flipping (BF) or min-sum (MS) decoder, finishes updating the messages/hard decision for a circulant, the processor 500 will update the CRC by feeding the circulant with a size of q bits into the CRC encoder. The process of these q bits in CRC encoder should take only 1 clock cycle. In this way, at the end of an iteration, all the CRC parity bits may be generated, so it can be checked if the CRC matches with the CRC bits in the user bits. If they match, further, the LDPC syndrome weight, or checksum, and the predetermined threshold T are compared. If the LDPC syndrome weight is less than the predetermined threshold T, the decoder may be terminated and output the hard decision as decoder output.

Even though there might be some remaining errors in parity bits, the user bits are all correct. We note that in chip-kill, the parity bits will also be useful to recover the errors in the parity portion of the other failure codeword. In this case, we can re-encode the user bits to get correct parity before XORing the hard decisions.

The decoder, including an On-the-fly error detection and termination (OEDT) decoder, can be terminated by following various set of rules, such as the example described in FIG. 8.

Accordingly, embodiments of the present disclosure may reduce the average iteration number of LDPC decoding algorithms and consequently to reduce the decoding latency of an LDPC decoder. With such scheme, embodiments of the present disclosure may reduce the latency and improve the throughput of our LDPC decoder.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A decoding method, comprising:
    calculating cyclic redundancy check (CRC) parity bits for data on-the-fly while the data is decoded using low-density parity-check (LDPC) decoding, the calculating of CRC parity bits being performed at each of a plurality of iterations of the LDPC decoding before the LDPC decoding is complete;
    updating the calculated CRC parity bits to generate CRC parity bits after each iteration of the LDPC decoding;
    comparing the generated CRC parity bits with CRC bits included in the data to determine whether the generated CRC parity bits match the CRC bits in the data; and
    terminating the LDPC decoding when the comparing indicates that the generated CRC parity bits match the CRC bits in the data.

2. The method of claim 1, further comprising determining LDPC checksum in accordance with the LDPC decoding.

3. The method of claim 2, wherein the terminating of the LDPC decoding comprises terminating the LDPC decoding when the generated CRC parity bits match with the CRC bits in the data and it is determined that the LDPC checksum is less than a predetermined threshold.

4. The method of claim 3, wherein the terminating of the LDPC decoding further comprises outputting hard decision values in accordance with the LDPC decoding.

5. The method of claim 1, wherein the updating of the calculated CRC parity bits comprises updating the calculated CRC parity bits by feeding predetermined bits into a CRC encoder.

6. The method of claim 1, wherein the performing of the LDPC decoding for the data comprises processing, for each iteration of the LDPC decoding, updating messages for a circulant.

7. A memory system, comprising:
   a storage; and
   a decoder coupled to the storage and suitable for:
   calculating cyclic redundancy check (CRC) parity bits for data from the storage on-the-fly while the data is decoded using low-density parity-check (LDPC) decoding, the calculating of CRC parity bits being performed at each of a plurality of iterations of the LDPC decoding before the LDPC decoding is complete;
   updating the calculated CRC parity bits to generate CRC parity bits after each iteration of the LDPC decoding;
   comparing the generated CRC parity bits with CRC bits included in the data to determine whether the generated CRC parity bits match the CRC bits in the data; and
   terminating the LDPC decoding when the comparing indicates that the generated CRC parity bits match the CRC bits in the data.

8. The memory system of claim 7, wherein the decoder is further suitable for determining LDPC checksum in accordance with the LDPC decoding.

9. The memory system of claim 8, wherein the decoder is further suitable for terminating the LDPC decoding when the comparing indicates that the generated CRC parity bits match with the CRC bits and it is determined that the LDPC checksum is less than a predetermined threshold.

10. The memory system of claim 9, wherein the decoder is further suitable for outputting hard decision values in accordance with the LDPC decoding.

11. The memory system of claim 7, wherein the decoder is further suitable for updating the calculated CRC parity bits by feeding predetermined bits into a CRC encoder.

12. The memory system of claim 7, wherein the decoder is further suitable for performing of the LDPC decoding for the data by processing, for each iteration of the LDPC decoding, updating messages for a circulant.

13. A memory controller, comprising:
   a receiver suitable for receiving data; and
   a decoder coupled with the receiver and suitable for:
   calculating cyclic redundancy check (CRC) parity bits for data on-the-fly while the data is decoded using low-density parity-check (LDPC) decoding, the calculating of CRC parity bits being performed at each of a plurality of iterations of the LDPC decoding before the LDPC decoding is complete;
   updating the calculated CRC parity bits to generate CRC parity bits after each iteration of the LDPC decoding;
   comparing the generated CRC parity bits with CRC bits included in the data to determine whether the generated CRC parity bits match the CRC bits in the data; and
   terminating the LDPC decoding when the comparing indicates that the generated CRC parity bits match the CRC bits in the data.

14. The memory controller of claim 13, wherein the decoder is further suitable for determining LDPC checksum in accordance with the LDPC decoding.

15. The memory controller of claim 14, wherein the decoder is further suitable for terminating the LDPC decoding, when the comparing indicates that the generated CRC parity bits match with the CRC bits and it is determined that the LDPC checksum is less than a predetermined threshold.

16. The memory controller of claim 15, wherein the decoder is further suitable for outputting hard decision values in accordance with the LDPC decoding.

17. The memory controller of claim 13, wherein the decoder is further suitable for updating the calculated CRC parity bits by feeding predetermined bits into a CRC encoder.

18. The memory controller of claim 13, wherein the decoder is further suitable for performing of the LDPC decoding for the data by processing, for each iteration of the LDPC decoding, updating messages for a circulant.

\* \* \* \* \*